(12) United States Patent
Chung et al.

(10) Patent No.: US 10,096,637 B2
(45) Date of Patent: Oct. 9, 2018

(54) PIXEL FOR CMOS IMAGE SENSOR AND IMAGE SENSOR INCLUDING THE SAME

(71) Applicant: SAMSUNG ELECTRONICS CO., LTD., Suwon-si, Gyeonggi-Do (KR)

(72) Inventors: Young Woo Chung, Seoul (KR); Tae Hun Lee, Suwon-si (KR); Hee Geun Jeong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/447,345

(22) Filed: Mar. 2, 2017

(65) Prior Publication Data

US 2017/0179170 A1 Jun. 22, 2017

Related U.S. Application Data

(63) Continuation of application No. 14/856,698, filed on Sep. 17, 2015, now Pat. No. 9,620,546.

(30) Foreign Application Priority Data

Sep. 22, 2014 (KR) .................. 10-2014-0126039

(51) Int. Cl.
*H01L 27/146* (2006.01)
*H01L 21/764* (2006.01)
(Continued)

(52) U.S. Cl.
CPC ........ *H01L 27/1463* (2013.01); *H01L 21/763* (2013.01); *H01L 21/764* (2013.01);
(Continued)

(58) Field of Classification Search
CPC .......... H01L 27/146–27/14893; H01L 21/764; H01L 21/76224; H01L 21/763; H01L 31/18; H01L 29/0649
See application file for complete search history.

(56) References Cited

U.S. PATENT DOCUMENTS 5,700,712 A 12/1997 Schwalke
5,888,876 A 3/1999 Shiozawa et al.
(Continued)

FOREIGN PATENT DOCUMENTS

JP 2013239569 11/2013
KR 20030051041 A 6/2003
(Continued)

*Primary Examiner* — Victor A Mandala
(74) *Attorney, Agent, or Firm* — Volentine, Whitt & Francos, PLLC

(57) ABSTRACT

A pixel of a complementary metal-oxide-semiconductor (CMOS) image sensor includes a semiconductor substrate having a first surface and a third surface formed by removing part of the semiconductor substrate from a second surface, an active region which is formed between the first surface and the third surface and which contains a photoelectric conversion element generating charges in response to light incident on the substrate at the third surface, and a trench-type isolation region formed from either of the first and third surfaces to isolate the active region from an adjacent active region. The trench-type isolation region is filled with first material in a process that leaves a void in the material, the void is filled or partially filled with second material, and then a layer of third material is formed over the resulting structure composed of the first and second materials.

20 Claims, 16 Drawing Sheets

(51) Int. Cl.
    *H01L 21/762* (2006.01)
    *H01L 21/763* (2006.01)
    *H01L 29/06* (2006.01)
    *H01L 31/18* (2006.01)

(52) U.S. Cl.
    CPC .. *H01L 21/76224* (2013.01); *H01L 27/14643* (2013.01); *H01L 27/14683* (2013.01); *H01L 27/14621* (2013.01); *H01L 27/14627* (2013.01); *H01L 29/0649* (2013.01); *H01L 31/18* (2013.01)

(56) References Cited

U.S. PATENT DOCUMENTS

| | | | |
|---|---|---|---|
| 6,518,144 B2 | 2/2003 | Nitta et al. | |
| 7,109,097 B2 | 9/2006 | Paranjpe et al. | |
| 7,393,756 B2 * | 7/2008 | Wellhausen | H01L 27/1087 257/E21.002 |
| 8,390,089 B2 | 3/2013 | Chen et al. | |
| 9,048,158 B2 * | 6/2015 | Kunikiyo | H01L 27/14603 |
| 2005/0176167 A1 * | 8/2005 | Lee | H01L 27/1463 438/60 |
| 2010/0006969 A1 * | 1/2010 | Park | H01L 27/14621 257/446 |
| 2010/0059815 A1 * | 3/2010 | Grivna | H01L 21/76232 257/330 |
| 2011/0180689 A1 | 7/2011 | Roy et al. | |
| 2012/0033119 A1 * | 2/2012 | Shinohara | H01L 27/14623 348/302 |
| 2012/0211863 A1 | 8/2012 | Ang | |
| 2013/0026599 A1 * | 1/2013 | Nakamura | H01L 24/13 257/508 |
| 2013/0075857 A1 * | 3/2013 | Choi | H01L 21/761 257/506 |
| 2013/0113061 A1 | 5/2013 | Lai et al. | |
| 2013/0285181 A1 * | 10/2013 | Lin | H01L 27/1463 257/432 |
| 2013/0307040 A1 * | 11/2013 | Ahn | H01L 27/1463 257/292 |
| 2014/0138785 A1 * | 5/2014 | Pralle | H01L 27/14627 257/432 |
| 2014/0374868 A1 * | 12/2014 | Lee | H01L 27/1463 257/446 |
| 2015/0115396 A1 | 4/2015 | Lemke et al. | |

FOREIGN PATENT DOCUMENTS

| | | |
|---|---|---|
| KR | 0670606 B1 | 1/2007 |
| KR | 20070058122 A | 6/2007 |
| KR | 20070070967 A | 7/2007 |
| KR | 0979711 | 8/2010 |
| KR | 1019699 | 2/2011 |

* cited by examiner

PIXEL FOR CMOS IMAGE SENSOR AND IMAGE SENSOR INCLUDING THE SAME

PRIORITY STATEMENT

This is a Continuation of U.S. application Ser. No. 14/856,698, filed Sep. 17, 2015, which claims priority under 35 U.S.C. § 119(a) to Korean Patent Application No. 10-2014-0126039 filed on Sep. 22, 2014, the disclosure of which is hereby incorporated by reference in its entirety.

BACKGROUND

The inventive concept relates to a complementary metal-oxide-semiconductor (CMOS) pixel or pixel array, an image sensor including the same, and to a method of forming a CMOS pixel or pixel array.

CMOS image sensors are characterized as solid-state sensing devices, whereas charge coupled device (CCD) image sensors are characterized as image sensors having high-voltage analog circuits. CMOS image sensors are less expensive to manufacture and relatively smaller than CCD image sensors and thus tend to consume less power than CCD image sensors. In addition, CMOS image sensors have been dramatically improved in terms of their performance. Therefore, CMOS image sensors are preferred for use in various electronic products including portable devices such as smart phones and digital cameras.

Such CMOS image sensors typically comprising an array of pixels each having a photoelectric conversion element. The photoelectric conversion element generates an electrical signal whose value depends on the quantity of light incident on the pixel comprising the photoelectric conversion element. The CMOS image sensor processes electrical signals so generated by the pixels to synthesize an image. With the recent demand for high-resolution images, the pixels of a CMOS image sensor must be miniaturized.

However, as the pixels become smaller, noise is more likely to occur due to a defect in an isolation film (or an isolation region) for isolating the pixels or elements in a pixel from each other.

SUMMARY

According to the inventive concept, there is provided a pixel unit comprising a semiconductor substrate having opposite major surfaces, and a trench extending vertically from one of the major surfaces to delimit an active region of the substrate, a photoelectric conversion element in the active region and that generates charges in response to light incident on one of the major surfaces of the substrate, and a trench isolation structure in the trench, and in which the trench-type isolation structure comprises a body of first material occupying a majority of the trench, second material disposed within the body of first material and creating a seam with the first material within the trench, and third material on the first and second materials.

According to the inventive concept, there is also provided a pixel unit comprising a semiconductor substrate having opposite major surfaces, and a trench extending vertically from one of the major surfaces to delimit an active region of the substrate, a photoelectric conversion element in the active region and that generates charges in response to light incident on one of the major surfaces of the substrate, and a trench isolation structure of electrically insulating material in the trench, and in which the electrically insulating material of the trench-type isolation structure comprises a first body of the insulating material occupying a majority of the trench and having a void therein that has an entrance within the trench, and second portion of the insulating material filling at least the entrance to the void so as to block the entrance.

According to the inventive concept, there is also provided a complementary metal-oxide-semiconductor (CMOS) image sensor comprising an array of pixels which generate pixel signals in response to incident light, and a signal processing circuit configured to output image data based on the pixel signals, and in which the array of pixels comprises a semiconductor substrate having opposite major surfaces, and a trench extending vertically from one of the major surfaces to delimit active regions of the substrate, and a trench isolation structure in the trench, in which each of the pixels comprises a photoelectric conversion element in a respective one of the active regions and each of which photoelectric conversion elements generates charges in response to light incident on one of the major surfaces of the substrate, and in which the trench-type isolation structure comprises a body of first material occupying a majority of the trench, second material disposed within the body of first material and creating a seam with the first material within the trench, and third material on the first and second materials.

BRIEF DESCRIPTION OF THE DRAWINGS

The above and other features and advantages of the inventive concept will become more apparent with reference to the detailed description that follows made with reference to the attached drawings in which.

DETAILED DESCRIPTION

Figure 1:
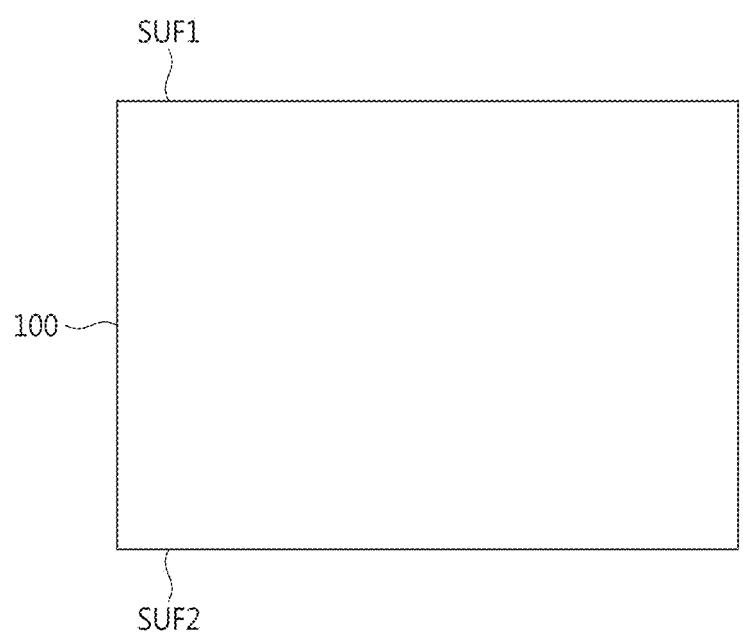
FIGS. 1-7 illustrate a method of manufacturing a pixel array of an image sensor according to the inventive concept, with each of FIGS. 1, 2, 3, 4, 5, 6 and 7 being a cross-sectional view of the pixel array during the course of its manufacture.

The inventive concept now will be described more fully hereinafter with reference to the accompanying drawings. This inventive concept may, however, be embodied in many different forms and should not be construed as limited to the examples disclosed herein. Rather, these examples are provided so that this disclosure will be thorough and complete, and will fully convey the scope of the inventive concept to those skilled in the art. In the drawings, the size and relative sizes of layers and regions may be exaggerated for clarity. Like numbers designate like elements throughout the drawings.

It will be understood that when an element is referred to as being "disposed on", "formed on", "connected to" or "coupled to" another element, it can be directly disposed, formed, connected or coupled to the other element or intervening elements may be present. In contrast, when an element is referred to as being "directly" disposed on, formed on, connected to or coupled to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure. Likewise, although stages of a method according to the inventive concept may be described in a particular order or referred to numerically such as "first", "second" and "third" stages, such descriptions do not limit the sequence in which the stages may be carried out according to the inventive concept and do not limit the stages as being carried out sequentially. That is, with respect to the latter, two or more stages may be performed at the same time.

The terminology used herein is for the purpose of describing particular examples only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. For example, although the term "trenches" may be used, it will apparent that such a term may be referring to segments of a contiguous trench that appear separate from one another in a cross-sectional view. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein. For example, the term "type" of material will generally refer to the specific element(s) constituting the material and not to broader categories such as metals or oxides.

An example of a method of manufacturing a pixel of an image sensor according the inventive concept will now be described in detail with reference to FIGS. 1 through 7.

Referring to FIG. 1, a silicon (Si) substrate (e.g., a p+ silicon substrate) 100 is prepared. Although the silicon substrate 100 is a single layer of silicon in the example illustrated in FIG. 1, e.g., is a bulk silicon substrate, the silicon substrate 100 may be formed of two or more layers. For instance, the substrate may comprise an epitaxial layer (e.g., a p– epitaxial layer) (not shown) on a silicon substrate (e.g., a p+ silicon substrate). The p– epitaxial layer may be grown using a silicon source gas to have the same crystalline structure as the p+ silicon substrate. The silicon source gas may include silane, dichlorosilane (DCS), trichlorosilane (TCS), or hexachlorodisilane (HCDS), or a combination thereof. In any case, the silicon substrate 100 has a first surface (or a top surface) SUF1 and a second surface (or a bottom surface) SUF2 opposite to the first surface SUF1.

Figure 2:
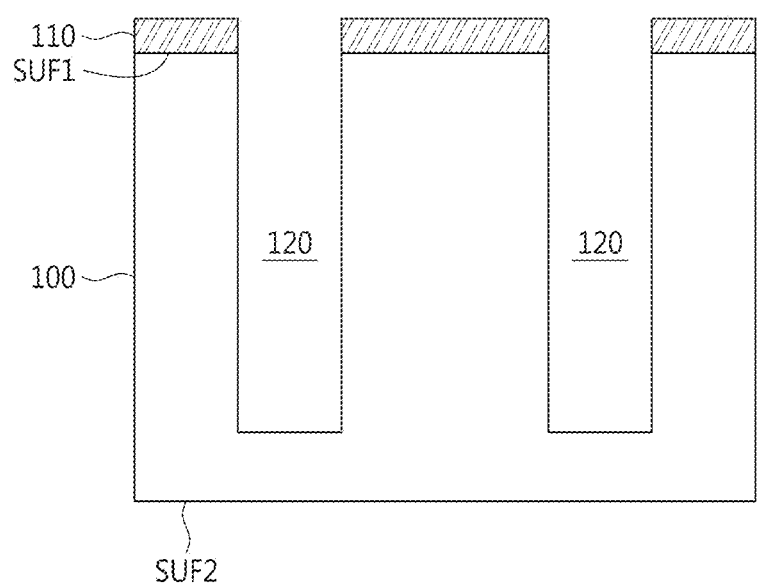

Referring to FIG. 2, a pattern 110 may be formed on the first surface SUF1 of the silicon substrate 100 to define active regions (ACT1 through ACT3 in FIG. 7) and a region (referred to hereinafter as an isolation film region 120) in which an isolation film (referred to hereinafter as an "isolation structure") will be formed. The isolation structure is artificially formed to electrically isolate elements from each other or active regions from each other. The isolation structure may be either a deep trench isolation (DTI) type of isolation film or a shallow trench isolation (STI) type of isolation film.

The silicon substrate 100 may be etched vertically from the first surface SUF1 toward the second surface SUF2 according to the pattern 110 to form the isolation film region 120. The isolation film region 120 may be formed by either a wet etch or a dry etch process.

Although the isolation film region 120 in the illustrated example defines deep trenches extending from the first surface SUF1 of the silicon substrate 100 in the current example, the inventive concept is not so limited. For example, the isolation film region 120 may define deep trenches extending from a surface of the silicon substrate 100 toward the first surface SUF1, which will be described later with reference to FIGS. 8A-8E.

Figure 3:
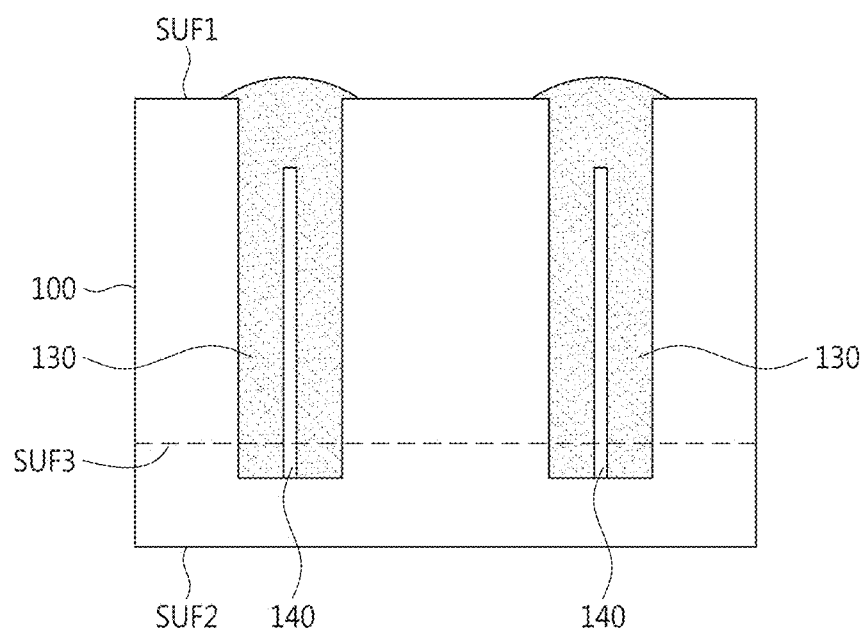

Referring to FIG. 3, at least one first material 130 is formed in the isolation film region 120. That is, the isolation film region 120 may be formed in at least one stage of depositing material into the trenches.

For example, a first material may be deposited conformally along the isolation film region 120 to line the trenches and then the remainder of the trenches defined by the isolation film region 120 may be filled with a second material, such that a first body of insulating material occupies a major portion of the trenches, collectively. The first material may be polysilicon doped with boron having a high reflectance and the second material may be polysilicon, but the inventive concept is not so limited. For example, the second material may be an oxide like hafnium oxide instead of polysilicon. The at least one material used to fill the isolation film region 120 will thus be referred to as first material 130 or a first body of insulating material for convenience's sake in the description that follows.

The filling of the isolation film region 120 with the first material 130 may vary by product or manufacturer or by the depth or dimension (i.e. length by width) of the isolation film region 120. The isolation film region 120 may be filled with the first material 130 using chemical vapor deposition (CVD). CVD is a process of exposing an object to precursor gas and applying external energy to yield a thin film through a reaction such as chemical bonding, decomposition of the precursor gas, or the like. For instance, low power CVD (LPCVD) may be used to fill the isolation film region 120 with the first material 130.

Even after the process of filling the isolation film region 120 with the first material 130 is completed, there may be an empty space 140 that is not filled with the first material 130 in the isolation film region 120. The empty space 140 will be referred to as a void.

The greater the depth or the length by width of the isolation film region 120, the more likely it is that the empty space 140 will form. For instance, when the first material 130 is injected into the isolation film region 120 at the entrance of the isolation film region 120, the entrance of the isolation film region 120 may be blocked before the isolation film region 120 is completely filled with the first material 130 and the empty space 140 is left in the isolation film region 120. When poly silicon is deposited on the isolation film region 120, a gap (which is a type of void) in the poly silicon may be created. If the subsequent processes were to be performed while the void was left in the polysilicon, the void would be exposed and enlarged by one of such subsequent process such as a wet cleaning process or the like. Such a void could impede the normal operation of an image sensor or may act as a leakage path, leading to a failure of an image sensor.

Figure 4:
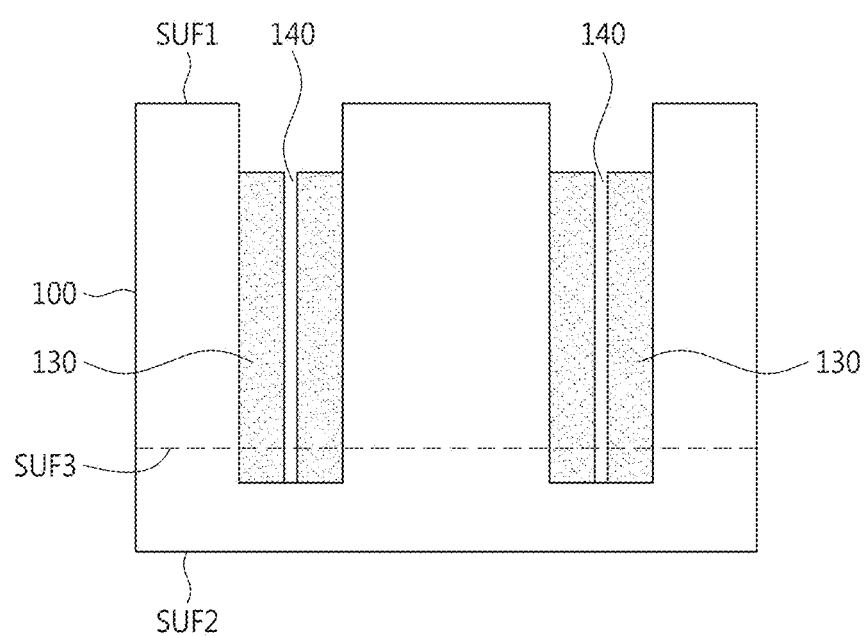

Referring to FIG. 4, a process of exposing the void 140 in the isolation film region 120 may be performed. In this process, some of the first material 130 filling the isolation film region 120 may be removed using an etch back process. Accordingly, the top portion of the first material 130 is removed, and the void 140 is exposed.

Figure 5A:
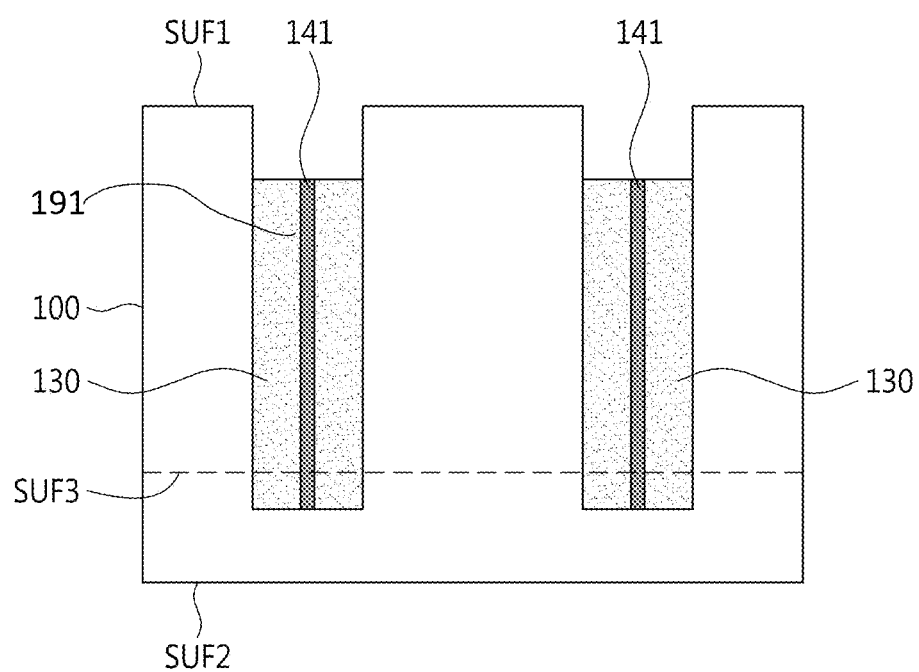
Figure 5B:
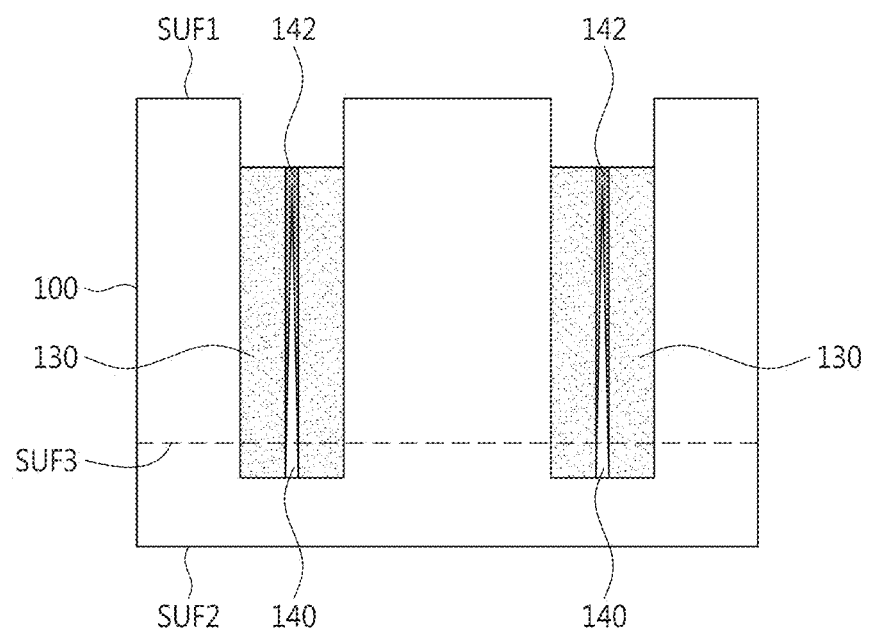

Referring to FIGS. 5A and 5B, a second portion of insulating material 141 or 142 is provided in the void 140 to fill or partially fill the void 140. Material 141 or 142 will be referred to as second material simply to distinguish it from the first material 130 used to initially fill the majority of the trenches of the isolation film region 120.

The first material 130 may be the same as or different from the second material 141 or 142. The second material 141 may vary by process or depending on the properties/type of the first material 130. The second material 141 may be an oxide or a nitride such as boron nitride or gallium nitride.

FIG. 5A shows a process in which the void 140 is filled with second material 141 and thus an entrance to the void 140 is blocked. That is, in one example, processes subsequent to the exposing of the void 140 are performed only once the void 140 has been filled. Alternatively, as shown in FIG. 5B, only part of the void 140 is filled with second material 142. In particular, in this example like the above-mentioned example, second material 142 is provided in the void until an entrance of the void 140 is blocked with the second material 142, but in this example subsequent processes are performed while part of the void beneath the blocked entrance remains unfilled. In either of these examples, LPCVD may also be used to deposit the second material 141 or 142 in the void 140.

Furthermore, in the example of FIG. 5A, a discernible seam 191 between the first material 130 and the second material 141 will evidence the filling of the void 140 by the second material 141 regardless of whether the first and second materials are of the same type of material, i.e., will evidence the pre-existence of the void 140. In the example of FIG. 5B, a discernible seam between the first material 130 and the second material 142 will also evidence the provision of the second material 142 in the void 140 but the pre-existence of the void 140 will also be clear from the remaining unfilled part of the void 140.

As described above, the process of filling the isolation film region 120 may be performed in at least two stages. In the first state, first material is formed in the trenches defined by the isolation film region 120 in a process that leaves a void 140 in the first material. In the second stage, the entrance of the void 140 is blocked by filling the void 140 or by filling only part of the void 140. Thus, the void is prevented from creating serious defects during subsequent processing.

Although not shown, another process may be carried out between the process of filling the isolation film region 120 with the first material 130 and the process of filling the void 140 with the second material 141 or 142. For example, a process of detecting the void 140 in the isolation film region 120 may be carried out after the isolation film region 120 is with the first material 130.

Figure 6A:
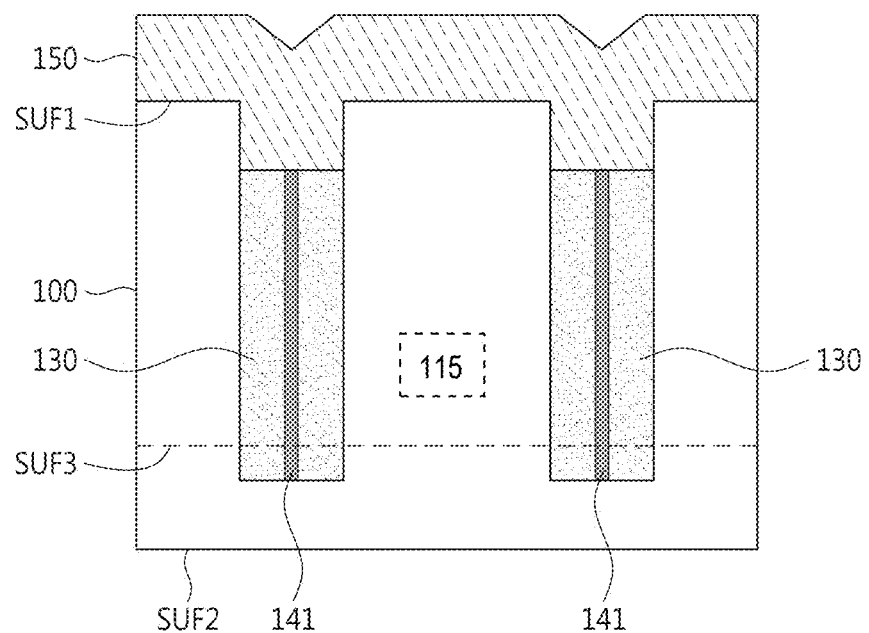
Figure 6B:
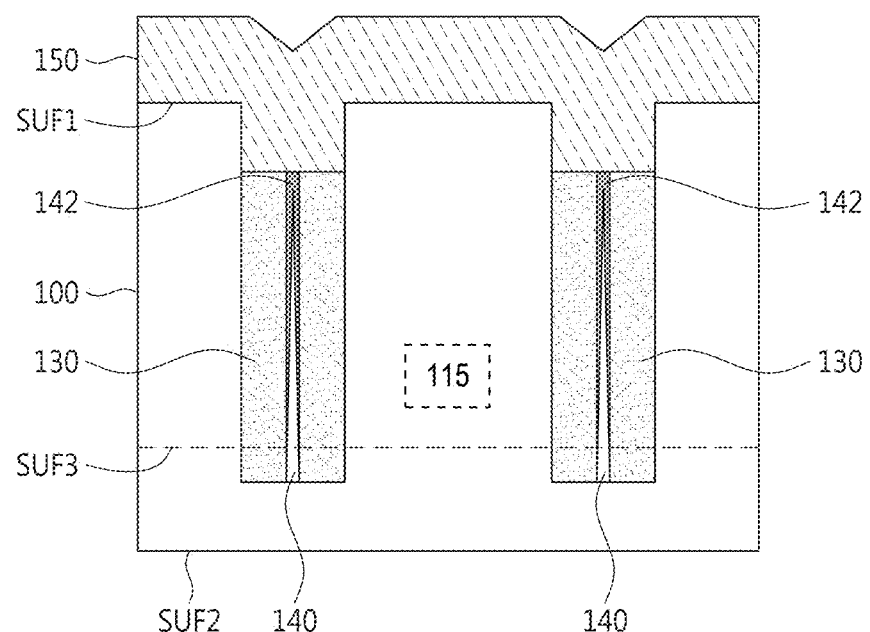

Referring to FIGS. 6A and 6B, a third portion of insulating material may be deposited on the first surface SUF1 and the isolation film region 120 to form a capping film 150 after the second material 141 or 142 has been provided in the void 140. The capping film 150 may be formed of an oxide, but the inventive concept is not so limited. The capping film 150 may be formed to cap the isolation film region 120 by covering the first material 130 and the second material 141 or 142 at the entrance to the void blocked by the second material 141 or 142.

The first material 130, the second material 141 or 142, and the third material 150 may be the same materials or materials different from one another.

Figure 7:
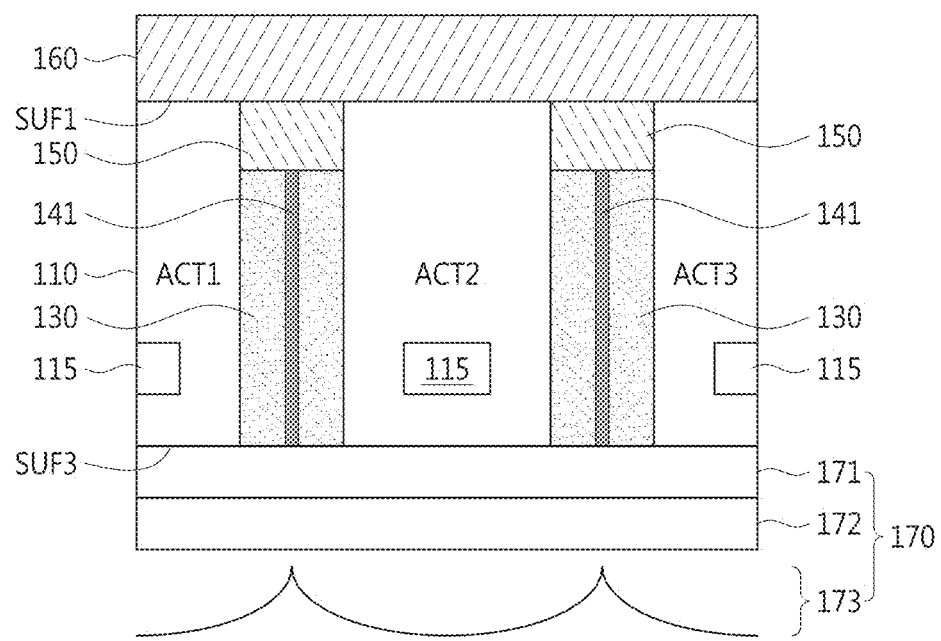

Referring to FIG. 7, a wiring layer 160 is formed on the first surface SUF1 of the silicon substrate 100. Before the wiring layer 160 is formed, the capping film 150 may be partially or entirely removed from the first surface SUF1. In addition, before the wiring layer 160 is formed, elements (e.g., a photoelectric conversion element 115 and a transistor (not shown)) of a pixel may be formed.

The wiring layer 160 may include a gate (not shown) of a transistor of a pixel and multi-layer conductive lines (not shown). The conductive lines may transfer signals between transistors or a pixel and an external component. The conductive lines may be formed by patterning conductive material comprising a metal such as copper or aluminum.

The thickness of the silicon substrate 100 may be reduced by removing some of the substrate at the second surface SUF2, thereby exposing a third surface SUF3 of the substrate. An incidence layer structure 170 is formed on the third surface SUF3 of the silicon substrate 100. For example, the third surface SUF3 may be formed by polishing the silicon substrate 100 at the second surface SUF2 using a mechanical method and/or a chemical method. At this time, the bottom portion of the isolation structure (e.g., the DTI structure) may also be removed. As a result, in this example, the DTI structure extends vertically through the silicon substrate 100 from the third surface SUF3 to the first surface SUF1. However, in another example the bottom of the DTI structure remains within the silicon substrate 100, i.e., is spaced vertically from the third surface SUF3.

The incidence layer structure 170 may include a flat layer 171, a color filter 172, and micro lenses 173. Each micro lens 173 may be formed on the top of a pixel (the side of the pixel where incident light is to first reach the pixel) as operatively associated with the pixel to focus light onto the photoelectric conversion element 115 of the pixel and thereby enhance the image quality.

The color filter 172 may be interposed between the micro lens 173 and the pixel(s) and may selectively transmit light of a predetermined wavelength (e.g., red, green, blue, magenta, yellow, or cyan). Light that has been transmitted by the color filter 172 is incident on a photoelectric conversion element 115 in each of the active regions ACT1 through ACT3 through the third surface SUF3. A size and a location of the photoelectric conversion element 115 in each of the active regions ACT1 through ACT3 may vary with products or manufacturers.

The flat layer 171 may be interposed between the color filter 172 and the third surface SUF3 and may prevent reflection of light transmitted through the micro lens 173 and the color filter 172. Alternatively, the flat layer 171 may also be interposed between the micro lens 173 and the color filter 172. The flat layer 171 transmits incident light efficiently, thereby enhancing the performance (such as light guiding efficiency and photo sensitivity) of an image sensor.

The combination of a pixel and its associated portion or portions of the incidence layer structure 170 may be referred to as a pixel unit.

As mentioned above, a photoelectric conversion element 115 of a respective pixel or pixel unit is formed in each of the active regions ACT1 through ACT3. The photoelectric conversion element 115 generates charges in response to incident light. The photoelectric conversion element 115 may be a photodiode, a phototransistor, a photogate, or a pinned photodiode.

In addition, a shallow isolation film, i.e., STI, may be formed in the active regions ACT1 through ACT3 to isolate elements from each other in each pixel. Such elements and STI may be formed in the active regions ACT1 through ACT3 before or after the process of forming the DTI structure. Accordingly, FIGS. 6A and 6B show the photoelectric conversion element 115, as formed in the active region before the process of forming the DTI structure.

Another example of a method of manufacturing a pixel of an image sensor according to the inventive concept will now be described with reference to FIGS. 8A through 8E.

Figure 8A:
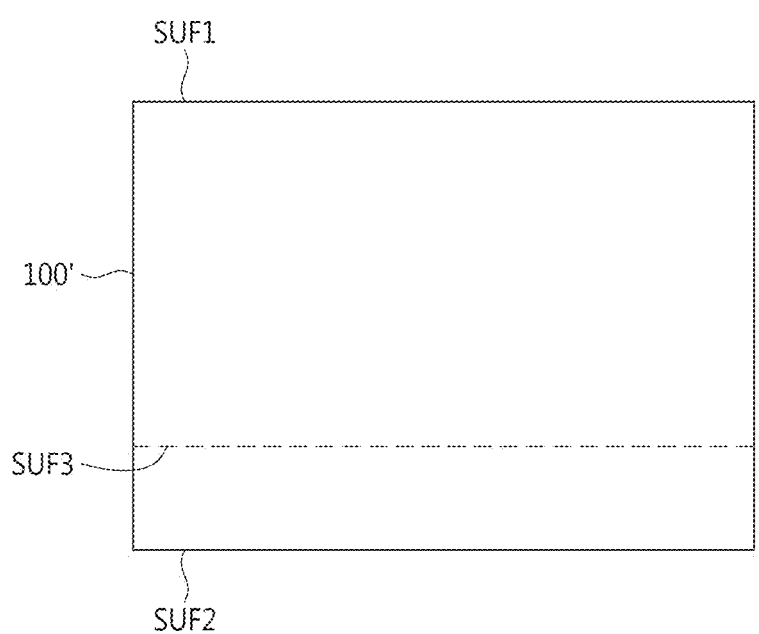
FIGS. 8A through 8E illustrate another method of manufacturing a pixel array of an image sensor according to the inventive concept, with each of FIGS. 8A, 8B, 8C, 8D and 8E being a cross-sectional view of the pixel during the course of its manufacture.

Referring to FIG. 8A, a silicon substrate 100' including first surface (or the top surface) SUF1 and second surface (or the bottom surface) SUF2 opposite to the first surface SUF1 is prepared. The silicon substrate 100' is similar to the silicon substrate 100 shown in and described with reference to FIG. 1 and thus a detailed description thereof will be omitted.

Figure 8B:
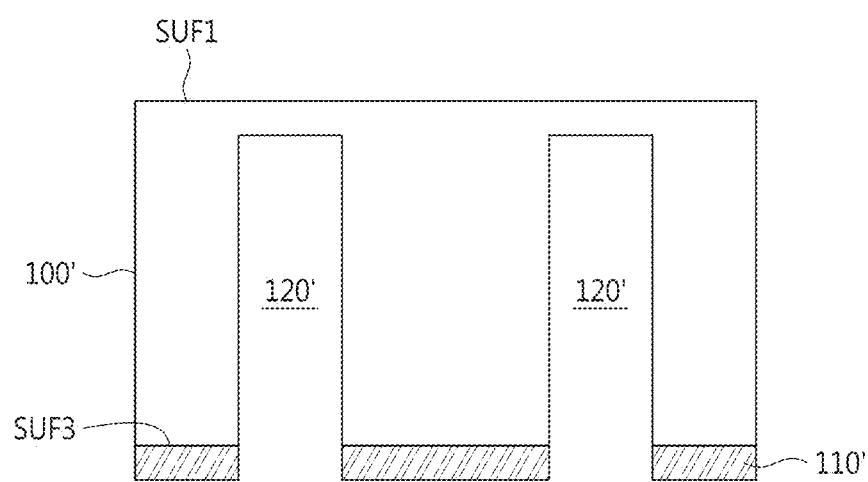

Referring to FIG. 8B, third surface SUF3 is formed by removing a predetermined thickness of the silicon substrate 100' from the second surface SUF2 using a mechanical and/or chemical process (e.g., chemical mechanical polishing (CMP)). Although not shown in FIGS. 8A and 8B, elements (such as a photoelectric conversion element and a transistor) of a pixel may be formed before the grinding process.

Subsequently, a pattern 110' may be formed on the third surface SUF3 of the silicon substrate 100' to define the active regions ACT1 through ACT3 and a region in which an isolation film will be formed, i.e., to form an isolation film region 120'. The silicon substrate 100' may be etched vertically from the third surface SUF3 toward the first surface SUF1 according to the pattern 110 to form the isolation film region 120'.

Figure 8C:
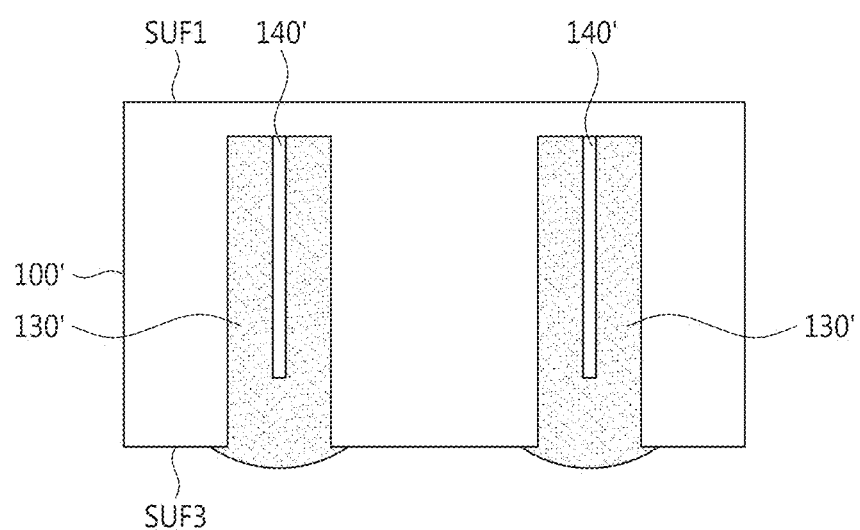
Figure 8D:
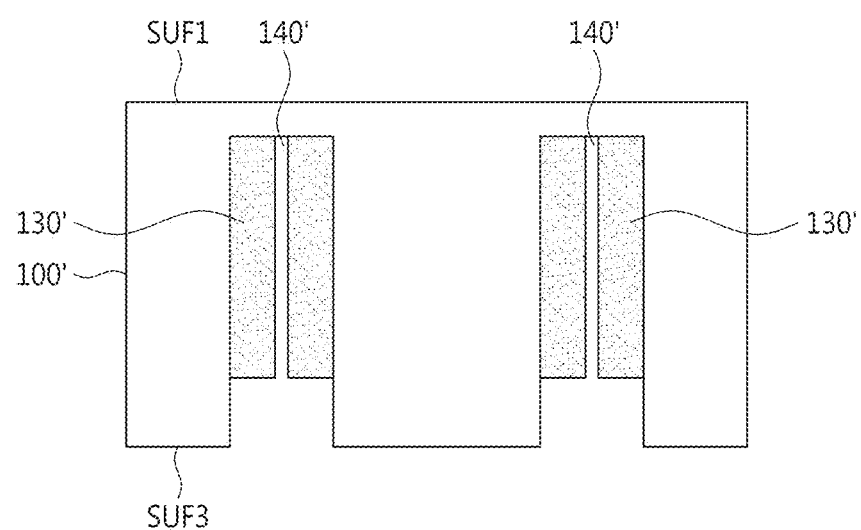

Referring to FIG. 8C, the isolation film region 120' is filled with first material 130'. The process of filling the isolation film region 120' with the first material 130' may be the same as the process described with reference to FIG. 3. Referring to FIG. 8D, a process of exposing a void 140' in the isolation film region 120' may be performed and the process may be the same as that described with reference to FIG. 4.

Figure 8E:
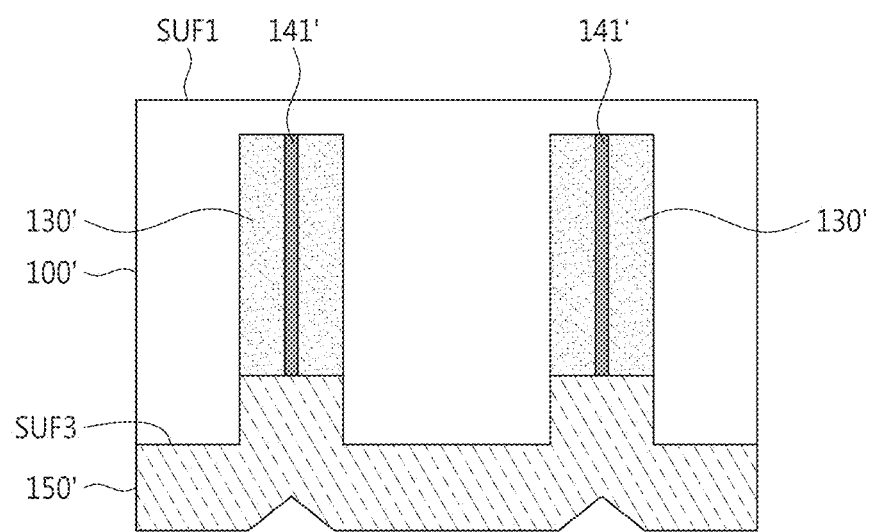

Referring to FIG. 8E, a process of filling the void 140' in the isolation film region 120' with a second material 141' and then a process of forming a capping film 150' may be performed. These processes may be the same as those described with reference to FIGS. 5A and 6B.

After the back DTI is formed as described above, a wiring layer (not shown) may be formed on the first surface SUF1 and an incidence layer structure (not shown) may be formed on the third surface SUF3 of the silicon substrate 100', as described with reference to FIG. 7.

Figure 9:
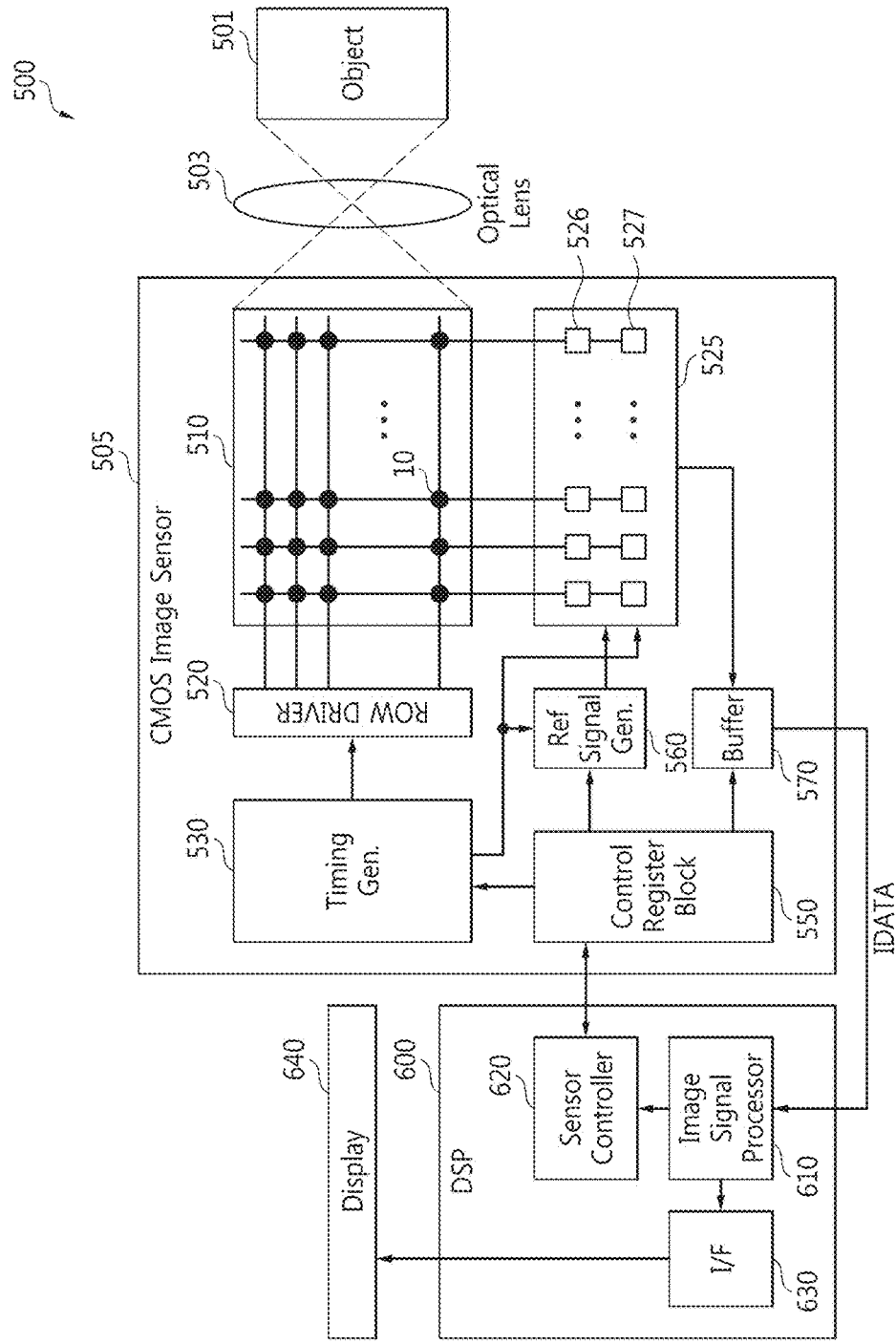
FIG. 9 is a block diagram of an image processing system including a pixel according to the inventive concept.

FIG. 9 shows an example of image processing system 500 including a pixel according to the inventive concept. The image processing system 500 may be that of a digital camera, a camcorder, or any other type of portable electronic device including a complementary metal-oxide-semiconductor (CMOS) image sensor 505. Examples of such a portable electronic device include cellular phones, smart phones, tablet personal computers (PCs), mobile internet devices (MIDs), wearable computers, internet of things (IoT) devices, and internet of everything (IoE) devices. The image processing system 500 includes an optical lens 503, the CMOS image sensor 505, a digital signal processor (DSP) 600, and a display 640.

The CMOS image sensor 505 may generate image data IDATA corresponding to the image of an object captured through the optical lens 503. The CMOS image sensor 505 includes a pixel array 510, a row driver 520, a readout circuit 525, a timing generator 530, a control register block 550, a reference signal generator 560, and a buffer 570. A signal processing circuit may include the readout circuit 525 and the buffer 570.

The pixel array 510 includes a plurality of pixels 10 generating a plurality of pixel signals in response to incident light. The pixels 10 may be manufactured using such processes as described with reference to FIG. 1 through 6 or 8A-8E. The pixels 10 are arranged in a matrix. Each of the pixels 10 sends an output signal to a corresponding column line.

The row driver 520 drives control signals for controlling the operation of the pixels 10 to the pixel array 510 according to the control of the timing generator 530. The row driver 520 may control the operations of the pixels 10 row by row. The row driver 520 may function as a control signal generator that generates the control signals.

The timing generator 530 controls the operations of the row driver 520, the readout circuit 525, and the reference signal generator 560 according to the control of the control register block 550. The readout circuit 525 includes an analog-to-digital converter (ADC) 526 for each column and a memory 527 for each column. The ADC 526 may perform correlated double sampling (CDS). The readout circuit 525 outputs a digital image signal corresponding to a pixel signal output from each of the pixels 10.

The control register block 550 controls the operations of the timing generator 530, the reference signal generator 560, and the buffer 570 according to the control of the DSP 600. The buffer 570 transmits the image data IDATA corresponding to digital image signals output from the readout circuit 525 to the DSP 600. The signal processing circuit may process (e.g., perform CDS and analog-to-digital conversion on) the pixel signals output from the pixel array 510 and may output the image data IDATA corresponding to the processing result.

The DSP 600 includes an image signal processor 610, a sensor controller 620, and an interface (I/F) 630. The image signal processor 610 controls the I/F 630 and the sensor controller 620 which controls the control register block 550. The CMOS image sensor 505 and the DSP 600 may be respectively provided in chips in a single package, e.g., a multi-chip package. Alternatively, the CMOS image sensor 505 and the image signal processor 610 may be respectively provided as separate chips that are not packaged together.

The image signal processor 610 processes the image data IDATA received from the buffer 570 and transmits processed image data to the I/F 630. The sensor controller 620 may generate various control signals for controlling the control register block 550 according to the control of the image signal processor 610. The I/F 630 may transmit the processed image data from the image signal processor 610 to the display 640. The display 640 may display the image data output from the I/F 630.

Figure 10:
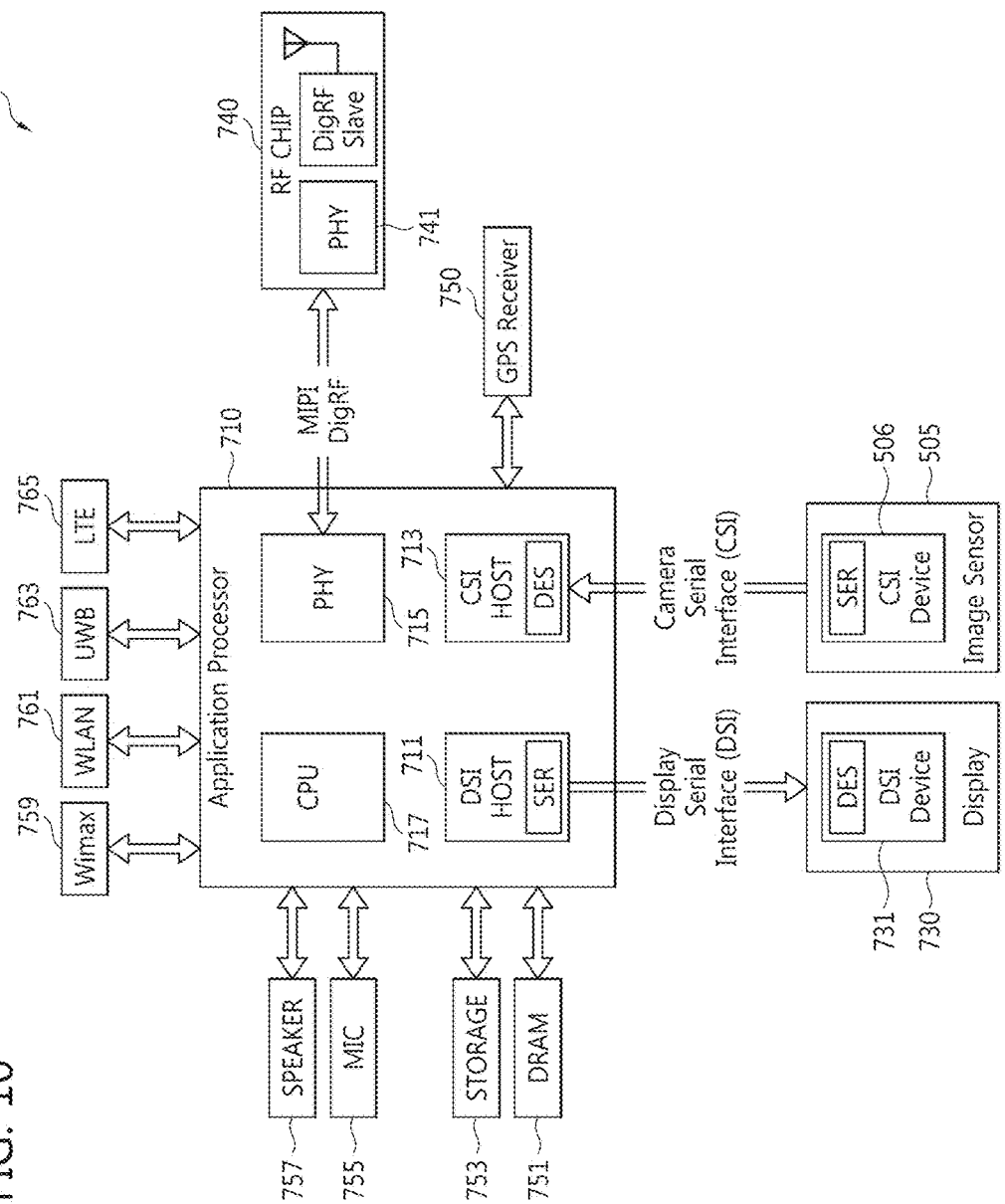
FIG. 10 is a block diagram of an image processing device including a pixel according to the inventive concept.

FIG. 10 illustrates an example of an image processing device 700 including a pixel according to the inventive concept. The image processing device 700 includes an application processor (AP) 710, the image sensor 505, and the display 730. The image processing device 700 may be that of a portable electronic device supporting a mobile industry processor interface (MIPI®). The image sensor 505 is a CMOS image sensor, and application processor (AP) 710 includes a processing circuit for processing the image data IDATA output from the CMOS image sensor 505.

A camera serial interface (CSI) host 713 of the AP 710 may perform serial communication with a CSI device 506 of the image sensor 505 through CSI. In this respect, the CSI host 713 and the CSI device 506 may include a deserializer DES and a serializer SER, respectively. The AP 710 may be realized in the form of an integrated circuit or a system on chip (SoC).

A display serial interface (DSI) host 711 of the AP 710 may perform serial communication with a DSI device 731 in the display 730 through DSI. In this respect, the DSI host 711 and the DSI device 731 may include a serializer SER and a deserializer DES, respectively. The deserializers DES and the serializers SER may process electrical signals or optical signals.

The image processing device 700 may also include a radio frequency (RF) chip 740 communicating with the AP 710. A physical layer (PHY) 715 in the AP 710 and a PHY 741 in the RF chip 740 may communicate with (transmit data to) each other according to MIPI DigRF. A central processing unit (CPU) 717 may control the operations of the DSI host 711, the CSI host 713, and the PHY 715.

The image processing device 700 may further include a global positioning system (GPS) receiver 750, a memory 751 such as dynamic random access memory (DRAM), a data storage section 753 comprising a non-volatile memory such as NAND flash-based memory, a microphone (MIC) 755, and/or a speaker 757. The image processing device 700 may communicate with external devices using at least one communication protocol or standard, e.g., worldwide interoperability for microwave access (Wimax) 759, wireless local area network (WLAN) 761, ultra-wideband (UWB) 763, or long term evolution (LTE™) 765. The image processing device 700 may also communicate with external wireless communication devices using Bluetooth or Wi-Fi.

As described above, according to the inventive concept, in a trench isolation structure-forming process for separating active regions of pixels from each other, a void formed in a first stage of the process is filled or at least has its entrance blocked in a second stage of the process. Therefore, the void is prevented from giving rise to serious defects in the processes that follow the trench isolation structure-forming process. As a result, a defective isolation film is prevented from being formed and therefore, the quality of images produced by a sensor comprising the pixels is enhanced.

Although the inventive concept has been particularly shown and described with reference to various examples thereof, it will be understood by those of ordinary skill in the art that various changes in forms and details may be made to such examples without departing from the spirit and scope of the inventive concept as defined by the following claims.

What is claimed is:

1. A semiconductor device comprising:
   a semiconductor substrate having a first surface and a second surface opposite to each other, and a trench extending vertically with respect to the first and the second surfaces through the semiconductor substrate from the first surface to the second surface;
   a photoelectric conversion element in an active region configured to generate charges in response to light incident on one of the first and second surfaces; and
   a trench isolation structure including a capping material and an isolation material, at least a portion of the capping material occupying a first portion of the trench and the isolation material occupying a second portion of the trench, the isolation material having a vertically extending void,
   wherein a top surface of the capping material has a concaved contour over the trench, and wherein the vertically extending void is isolated from the capping material within the trench by a top portion of the isolation material.

2. The semiconductor device of claim 1, wherein the concaved contour comprises a v-shaped contour.

3. The semiconductor device of claim 1, wherein the capping material extends in a direction parallel to the first surface.

4. The semiconductor device of claim 1, wherein the isolation material occupies more of the trench than the capping material.

5. The semiconductor device of claim 1, wherein the trench separates active regions of pixels from each other.

6. The semiconductor device of claim 5, further comprising an incidence layer structure extending over the second surface of the semiconductor substrate, wherein the incidence layer structure comprises a micro lens that focuses light incident on the pixels, and a color filter that selectively transmits light focused by the micro lens.

7. The semiconductor device of claim 6, further comprising a wiring layer on one of the first and second surfaces of the semiconductor substrate.

8. A semiconductor device comprising:
   a semiconductor substrate having a trench extending from a first surface to a second surface of the semiconductor substrate;
   a photoelectric conversion element in an active region of the semiconductor substrate configured to generate charges in response to light incident on one of the first and second surfaces of the semiconductor substrate;
   an isolation material disposed in a first portion of the trench, the isolation material extending vertically with respect to the first and second surfaces of the substrate, the isolation material having a vertically extending void; and
   a capping material disposed in a second portion of the trench and on the isolation material,
   wherein a top surface of the capping material has a concaved contour over the trench, and wherein the vertically extending void is isolated from the capping material within the trench by a top portion of the isolation material.

9. The semiconductor device of claim 8, wherein the concaved contour comprises a v-shaped contour.

10. The semiconductor device of claim 8, wherein the capping material extends in a direction parallel to the first surface.

11. The semiconductor device of claim 8, wherein the isolation material occupies more of the trench than the capping material.

12. The semiconductor device of claim 8, wherein the trench separates active regions of pixels from each other.

13. The semiconductor device of claim 12, further comprising an incidence layer structure extending over the second surface of the semiconductor substrate, wherein the incidence layer structure comprises a micro lens that focuses light incident on the pixels, and a color filter that selectively transmits light focused by the micro lens.

14. The semiconductor device of claim 13, further comprising a wiring layer on one of the first and second surfaces of the semiconductor substrate.

15. A method of forming a complementary metal-oxide-semiconductor (CMOS) image sensor device having a photoelectric conversion element, the method comprising:
- forming a vertically extending trench in a semiconductor substrate;
- disposing an isolation material in the trench, the isolation material including a vertically extending void;
- recessing a portion of the isolation material at a first surface of the semiconductor substrate;
- disposing a capping material in the trench and on a top surface the isolation material so that the vertically extending void is isolated from the capping material; and
- removing a bottom portion of the semiconductor substrate to expose a bottom surface of the isolation material.

16. The method of claim 15, further comprising forming an incidence layer structure extending over the exposed bottom surface of the isolation material, wherein the incidence layer structure comprises a micro lens that focuses light incident on pixels, and a color filter that selectively transmits light focused by the micro lens.

17. The method of claim 15, wherein a top surface of the capping material has a concaved contour over the trench.

18. The method of claim 15, wherein the isolation material occupies more of the trench than the capping material.

19. The method of claim 15, wherein the trench separates active regions of pixels from each other.

20. The method of claim 15, further comprising forming a wiring layer on the first surface of the semiconductor substrate.

* * * * *